United States Patent
Wenzel

(10) Patent No.: US 7,659,989 B2
(45) Date of Patent: Feb. 9, 2010

(54) FOCUS DETERMINATION FOR LASER-MASK IMAGING SYSTEMS

(75) Inventor: Thomas Wenzel, Goettingen (DE)

(73) Assignee: Coherent, Inc., Santa Clara, CA (US)

( * ) Notice: Subject to any disclaimer, the term of this patent is extended or adjusted under 35 U.S.C. 154(b) by 37 days.

(21) Appl. No.: 11/824,090

(22) Filed: Jun. 29, 2007

(65) Prior Publication Data

US 2009/0002687 A1 Jan. 1, 2009

(51) Int. Cl.
*G01N 21/55* (2006.01)
(52) U.S. Cl. ............... 356/445; 356/498; 356/624; 355/55; 355/56; 355/67
(58) Field of Classification Search .......... 356/445, 356/498, 624, 448; 355/55, 56, 67
See application file for complete search history.

(56) References Cited

U.S. PATENT DOCUMENTS

| | | | | |
|---|---|---|---|---|
| 5,300,766 | A | 4/1994 | Granger et al. ........... | 250/201.9 |
| 5,502,311 | A * | 3/1996 | Imai et al. ................. | 250/557 |
| 5,789,734 | A | 8/1998 | Torigoe et al. ........... | 250/201.2 |
| 6,360,012 | B1 | 3/2002 | Kreuzer ..................... | 382/211 |
| 6,494,371 | B1 | 12/2002 | Rekow et al. .............. | 235/454 |
| 6,577,380 | B1 * | 6/2003 | Farmiga et al. ............ | 355/67 |
| 6,867,846 | B2 | 3/2005 | Poultney ..................... | 355/55 |
| 7,342,641 | B2 * | 3/2008 | Sogard ........................ | 355/55 |
| 2002/0080338 | A1 | 6/2002 | Taniguchi ................... | 355/67 |
| 2003/0086078 | A1 | 5/2003 | Nakauchi ................. | 356/124.5 |
| 2003/0133099 | A1 | 7/2003 | Shiode ........................ | 356/124 |
| 2005/0122494 | A1 | 6/2005 | Kuchibhotla et al. ......... | 355/47 |
| 2006/0007554 | A1 | 1/2006 | Ferber et al. ................ | 359/630 |
| 2007/0109519 | A1 | 5/2007 | Ferber ........................ | 355/67 |

FOREIGN PATENT DOCUMENTS

| | | |
|---|---|---|
| WO | WO 00/19261 | 4/2000 |
| WO | WO 2005/031466 A1 | 4/2005 |

* cited by examiner

*Primary Examiner*—Gregory J Toatley, Jr.
*Assistant Examiner*—Iyabo S Alli
(74) *Attorney, Agent, or Firm*—Morrison & Foerster LLP

(57) ABSTRACT

A system and method for calibrating the focal position of the imaging plane of a sequential lateral solidification (SLS) system. A test pattern is formed on a test substrate while varying the z-position of the focal position. Information concerning the z-position of the focal position is stored by a data processing system for various positions in the test pattern. An inspection light beam is directed onto the test pattern at a predetermined angle. The reflection of the inspection light beam is detected by an optical detector. The data processing system analyzes the reflection and determines whether the reflected light is substantially specular or substantially scattered. The data processing system uses the analysis of the reflected light and the information concerning the z-position of the focal position to select an optimal focal position for calibrating the SLS system.

19 Claims, 4 Drawing Sheets

FOCUS DETERMINATION FOR LASER-MASK IMAGING SYSTEMS

FIELD OF THE INVENTION

The present invention relates to methods and systems for calibrating the focal position of the imaging system of a laser-mask imaging system for use with sequential lateral solidification (SLS) processes.

BACKGROUND OF THE INVENTION

Thin film transistor (TFT) technology is the basis for high-resolution, high-performance liquid crystal display (LCD) screens. TFT technology provides the best resolution of the various flat-panel display technologies that are currently available. Advanced TFT technology is based on polycrystalline silicon.

Polycrystalline silicon may be formed using laser recrystallization techniques such as excimer laser annealing (ELA). In ELA, a high-power laser beam is scanned over the surface of a substrate that is coated with amorphous silicon. The amorphous silicon is heated, melts and then recrystallizes into polycrystalline silicon.

A more recently introduced laser recrystallization technique is 2-shot sequential lateral solidification. In a typical application, a two-dimensional mask pattern is imaged upon the amorphous silicon film by an imaging lens. Only the irradiated areas melt and recrystallize. By repetitive irradiation of different areas, the whole substrate silicon film can be recrystallized. The resulting quality of the polycrystalline silicon film exceeds that of ELA processed material in various parameters.

TFT technology requires extremely high quality processes and high process speeds. These requirements place great demands on the parameters of the imaging of an SLS system. It is particularly important for the focal plane of the imaging lens to be precisely determined. One conventional approach to focus determination in SLS systems involves visual inspection of test patterns. The test patterns are formed in a substrate while varying the z-position of the focal plane of the image. The substrate is then removed from the SLS system and visually examined by a human operator under a bright source of light. The operator looks for differences in the surface texture of the substrate. These differences are called protrusions. The protrusions are formed most sharply and clearly at points in the test pattern where the focal position of the image was adjusted correctly. By manually inspecting the surface texture of the substrate, a human operator can select a focal plane and calibrate the SLS system accordingly.

There are a number of challenges associated with this conventional approach to calibration. First, in order for a human operator to visually inspect a substrate, the substrate must be removed from the associated SLS system. This removal costs time and money and significantly increases the risk of damage to a substrate. The removal is particularly problematic in the case of larger substrates such as G4 and G5 substrates. In addition, because the necessary visual inspection must be conducted by a human operator, the operator must be given special training. Even with such training, the results produced by human operators tend to be somewhat inconsistent and subjective.

SUMMARY OF THE INVENTION

Methods and systems consistent with the present invention enable accurate determination of the focal plane of a sequential lateral solidification (SLS) system. In accordance with the invention, a test pattern is formed on a test substrate while varying the z-position of the focal plane of the imaging lens. Information concerning the z-position of the focal position is recorded at various positions in the test pattern and stored in a data processing system. After completion of the test pattern, an inspection light beam is directed onto the surface of the test pattern at a predetermined angle. The reflection of the inspection light beam is detected by an optical detector. The data processing system analyzes the data gathered concerning the reflection and determines whether the reflected light is substantially specular or substantially scattered. The data processing system then compares the results of the analysis with the stored data concerning the z-position of the focal plane and selects an optimal focal position for calibrating the SLS system. The SLS system is then manually or automatically calibrated.

In accordance with one aspect of the invention, a method is provided for calibrating a focal plane of an SLS system. The method includes the steps of forming a test pattern by the SLS system in a substrate by directing the laser onto the substrate in a predetermined pattern; varying a z-position of the focal plane of the imaging lens while forming the test pattern; storing information concerning the variation of the focal plane in a data processing system; directing an inspection beam of collimated light onto the test pattern at a predetermined angle; detecting a reflection of the inspection beam with an optical detector; analyzing the reflection to determine if the reflection is substantially specular or substantially scattered; and comparing the analysis of the reflection with the stored information to select one of the z-positions as a calibration focal plane for the imaging lens.

In accordance with another aspect of the invention, an SLS system is provided. The SLS system includes a xyz-translation stage for manipulating the x, y and z position of a substrate; a laser for generating a laser beam and an optical system to form a test pattern in the substrate, the optical system having a focal plane; a data processing system for storing information concerning the z-position of the focal plane during the formation of the test pattern; a light source for generating an inspection light beam and for directing the inspection light beam onto the test pattern; and an optical detector for detecting a reflection of the inspection light beam that is reflected from the test pattern. The data processing system analyzes the reflection to determine if the reflection is substantially specular or substantially scattered. The data processing system also compares the information concerning the z-position of the focal position stored during the formation of the test pattern with the results of the analysis of the reflection to select an optimal focal position for calibrating the SLS system.

In accordance with another aspect of the invention, a calibration system is provided for calibrating a focal plane of the SLS system. The calibration system includes a laser for generating a laser beam for forming a test pattern in a substrate, the laser having a focal position; a translation stage for varying a z-position of the focal position of the laser while forming the test pattern; a data-processing system for storing information concerning the variation of the focal position; means for directing an inspection beam of collimated light onto the test pattern at a predetermined angle; and means for detecting a reflection of the inspection beam. The data processing system includes a program for analyzing the reflection to determine if the reflection is substantially specular or substantially scattered and for comparing the results of the analysis with the stored information to select a specific z-position as a calibration focal position for the laser.

The features and advantages of the various aspects of the present invention will be more fully understood and appreciated upon consideration of the following detailed description of the invention and the accompanying drawings, which set forth illustrative embodiments in which concepts of the invention are utilized.

DETAILED DESCRIPTION OF THE INVENTION

Figure 1:
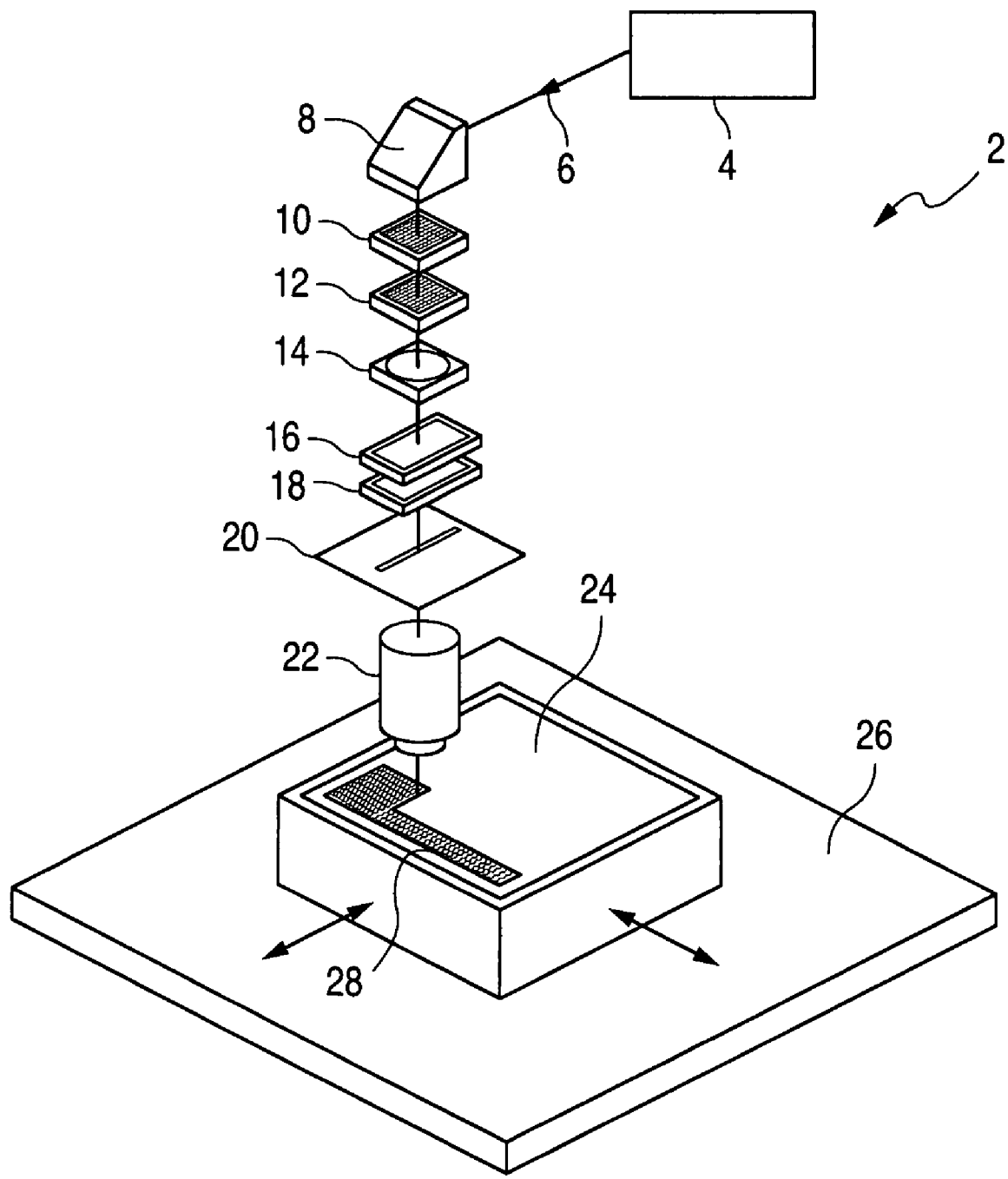
FIG. 1 illustrates an embodiment of a SLS system in accordance with the concepts of the present invention.

FIG. 1 shows an exemplary SLS system 2 in accordance with the present invention. The SLS system 2 includes a laser 4 for generating a laser beam 6 for use in forming polycrystalline silicon. The laser beam 6 is guided by a guiding mirror 8, which directs the laser beam 6 through beam homogenizers 10, 12 and beam shaping optics 14, 16, 18. After being homogenized and shaped, the laser beam 6 is directed through a mask 20. The mask 20 is a sheet of material with a pattern of transparent and opaque sections for passing and blocking the laser beam 6. After passing through the mask 20, the laser beam 6 passes through a projection lens 22 that projects the mask pattern onto a substrate 24. The substrate 24 rests on a xyz-translation stage 26. The xyz-translation stage 26 manipulates the x, y and z positions of the substrate 24.

The SLS system 2 forms a test pattern 28 in the substrate 24 by imaging a test mask pattern onto the substrate 24. This test pattern may be identical to the process pattern. The exemplary test pattern 28 illustrated in FIG. 1 consists of a series of parallel lines or rectangular areas, although those skilled in the art will appreciate that many additional patterns are consistent with the concepts of the invention. For each of the test patterns 28, the SLS system 2 varies the z-position of the focal point of the image plane. This variation of the z-position may comprise, for example, incrementing the z-position for each pattern by a step of a fixed size, such as 5 micrometers. In this manner, each of the test patterns 28 is formed using a different laser focal position. During the formation of the test patterns 28, a data processing system (not shown in FIG. 1) stores information concerning the focal plane position for each pattern. For example, the data processing system may record that a first pattern is formed at a first focal position and that a second pattern is formed at a second focal position.

Figure 2:
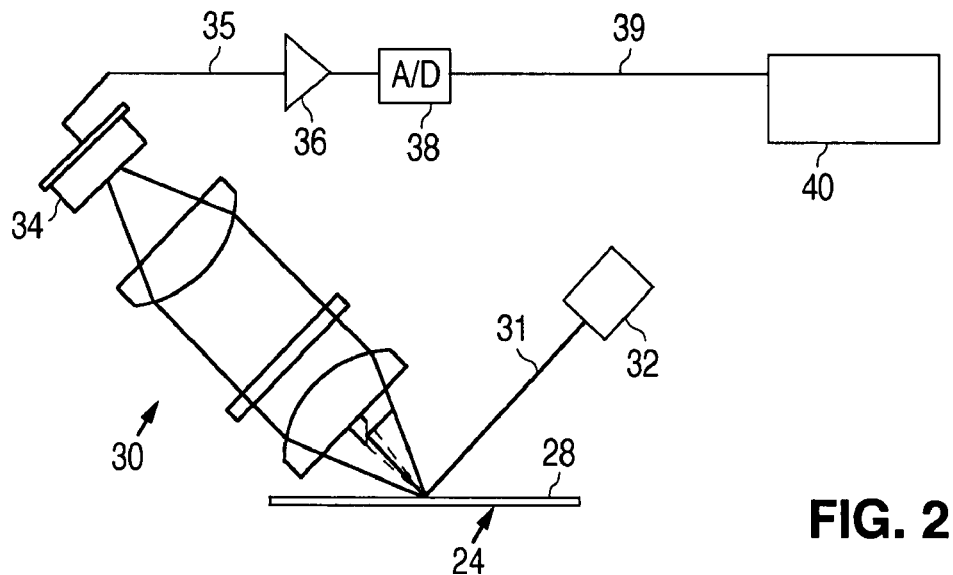
FIG. 2 illustrates an embodiment of an optical inspection apparatus in accordance with the concepts of the present invention.

FIG. 2 shows an exemplary optical inspection apparatus 30 in accordance with the present invention. The optical inspection apparatus 30 includes an inspection beam source 32 and an optical detector 34. The inspection beam source 32 generates an inspection beam 31 of collimated light. The inspection beam 31 is directed onto the surface of the substrate 24 at a predetermined angle. The inspection beam 31 is then at least partially reflected from the substrate 24. The optical detector 34, which includes a photosensitive element, detects the inspection beam 31 and produces an output signal 35 that is indicative of whether the reflection of the inspection beam 31 is substantially specular or substantially scattered. The optical detector 34 distinguishes between specular and scattered reflection by measuring the intensity of higher order reflections. The optical detector 34 may comprise, for example, a charge-coupled device (CCD) or a row of light diodes, as well as optics such as projection lenses.

The output signal 35 from the optical detector 34 is provided to an amplifier 36 and an analog-to-digital converter 38. The output 39 of the analog-to-digital converter 38 is provided to a data processing system 40. The data processing system 40 may be a standalone general-purpose computer or a special-purpose computing system. The data processing system 40 may be integrated with an SLS system or with some part of it, such as an optical-inspection apparatus, a CCD camera or a frame grabber. The data processing system 40 may also be provided separately.

Referring to FIGS. 1 and 2, the calibration of the focal plane of the SLS system 2 begins with the formation of the test pattern 28 in the substrate 24. After completion of the test pattern 28, the optical inspection apparatus 30 directs the inspection beam 31 onto the surface of the test pattern 28. The xyz-translation stage 26 manipulates the position of the substrate 24 so that the inspection beam 31 strikes different positions in the test pattern 28. When the inspection beam 31 strikes a position in the test pattern 28 that includes protrusions, the reflection of the inspection beam is substantially scattered. When the inspection beam 31 strikes a position in the test pattern 28 that is substantially free of protrusions, the reflection of the inspection beam is substantially specular. This difference in the characteristics of the reflection are due to the fact that the areas in the test pattern 28 that were formed with an optimal laser focal position tend to include substantial protrusions, while the areas that were formed with a less than optimal laser focal position tend to be substantially free of protrusions.

Information concerning the characteristics of the reflection of the inspection beam 31 is provided to the data processing system 40. The data processing system 40 utilizes this information to determine whether the light reflected from a particular position in the test pattern 28 is substantially specular or substantially diffracted. The data processing system 40 compares the z-position data stored during the formation of the test pattern 28 with the information generated by the optical inspection apparatus 30. The data processing system 40 determines the focal position that corresponds to a position in the test pattern 28 for which the reflection of the inspection beam 31 was substantially specular. In this way, the data processing system 40 determines the optimal z-position for calibrating the focal plane of the SLS system. The actual calibration of the laser may be carried out manually or automatically.

Figure 3:
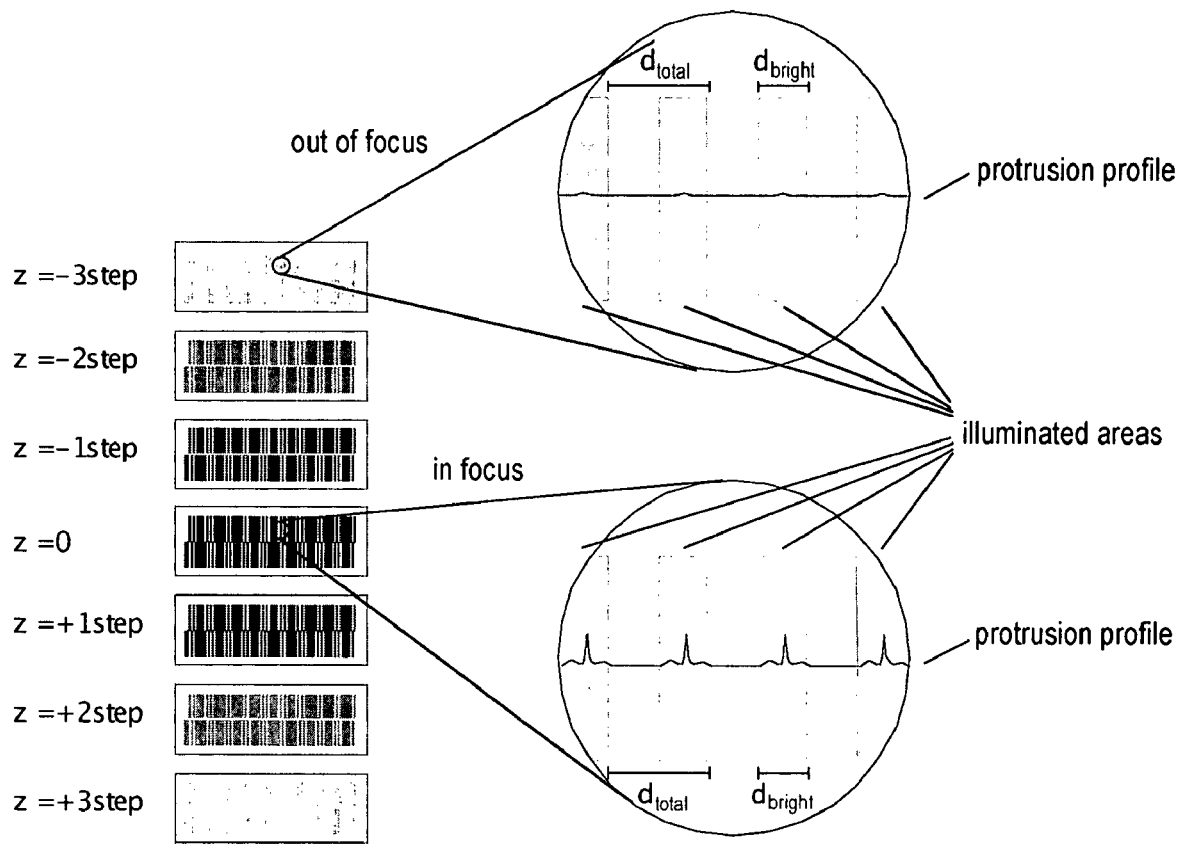
FIG. 3 illustrates an embodiment of a test pattern in accordance with the concepts of the present invention.

FIG. 3 illustrates an exemplary sequence of test patterns 28 consistent with the present invention. Each test pattern 28 consists of a series of parallel lines or rectangular areas (for an example, see also FIG. 6. Those skilled in the art will appreciate that various sizes, shapes and arrangements of test patterns are within the scope of the invention. Each single test pattern 28 is formed using a different laser focal position. In FIG. 3, the focal (z)-position is incremented by a series of steps consisting of z=−3 through z=+3. An exemplary focal step size is 5 micrometers.

The right side of FIG. 3 shows expanded views of two test patterns 28, as well as two example protrusion height profiles. The gray shaded areas 50 illustrate the illuminated areas in which the protrusion profiles evolve. Furthermore, only the upper part of each gray shaded area 50 is depicted. Those structures are periodically arranged, and the length of periodicity is $d_{total}$. The length of a structure is denoted by $d_{bright}$ and corresponds to the width of a gray shaded area 50. As can be seen from the protrusion profiles, maxima of the protrusion's height are located in the plane of focus, whereas the protrusions out of focus are very weak.

Figure 4:
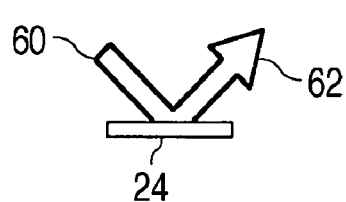
FIG. 4 illustrates specular reflection of an inspection beam at a surface position having substantially no protrusions.

FIG. 4 illustrates a specular reflection 62 of an inspection beam 60. This is the typical case for reflection on test patterns out of focus with weak protrusion profile. The inspection beam 60 comprises a collimated (monochromatic or polychromatic) light beam. The inspection beam 60 strikes the surface of the substrate 24 at a predetermined angle. A predetermined angle for a typical substrate is between 45-60 degrees with respect to the normal of the surface of the substrate 24. The predetermined angle is selected based on the characteristics of the substrate and the form of the protrusions.

Figure 5:
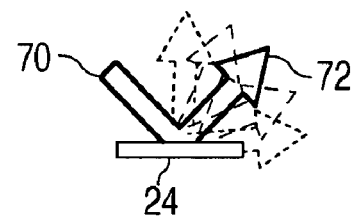
FIG. 5 illustrates scattered reflection of an inspection beam at a surface position having substantial protrusions.

FIG. 5 illustrates a scattered reflection 72 of an inspection beam 70. This is a typical case for reflection on test patterns in the plane of focus. The number and intensity of the optical orders of the reflection depend on the form of the protrusions in the test pattern and the material of the substrate. The characteristics of the reflection of the inspection beams 60, 70 represent a fingerprint of the associated protrusions. An appropriate image plane for the system is determined by comparing the fingerprints of the test pattern with the corresponding laser z-positions.

Figure 6:
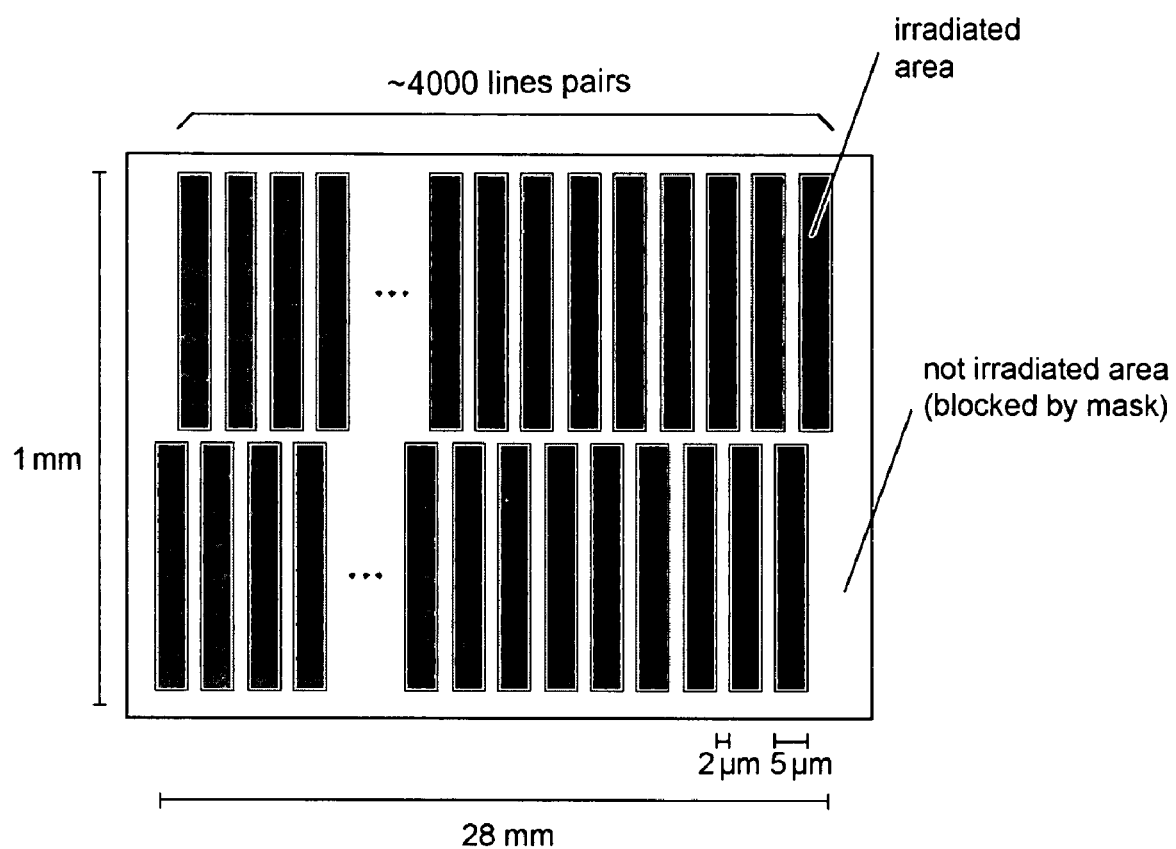
FIG. 6 illustrates an SLS process pattern consistent with the concepts of the present invention.
Figure 7:
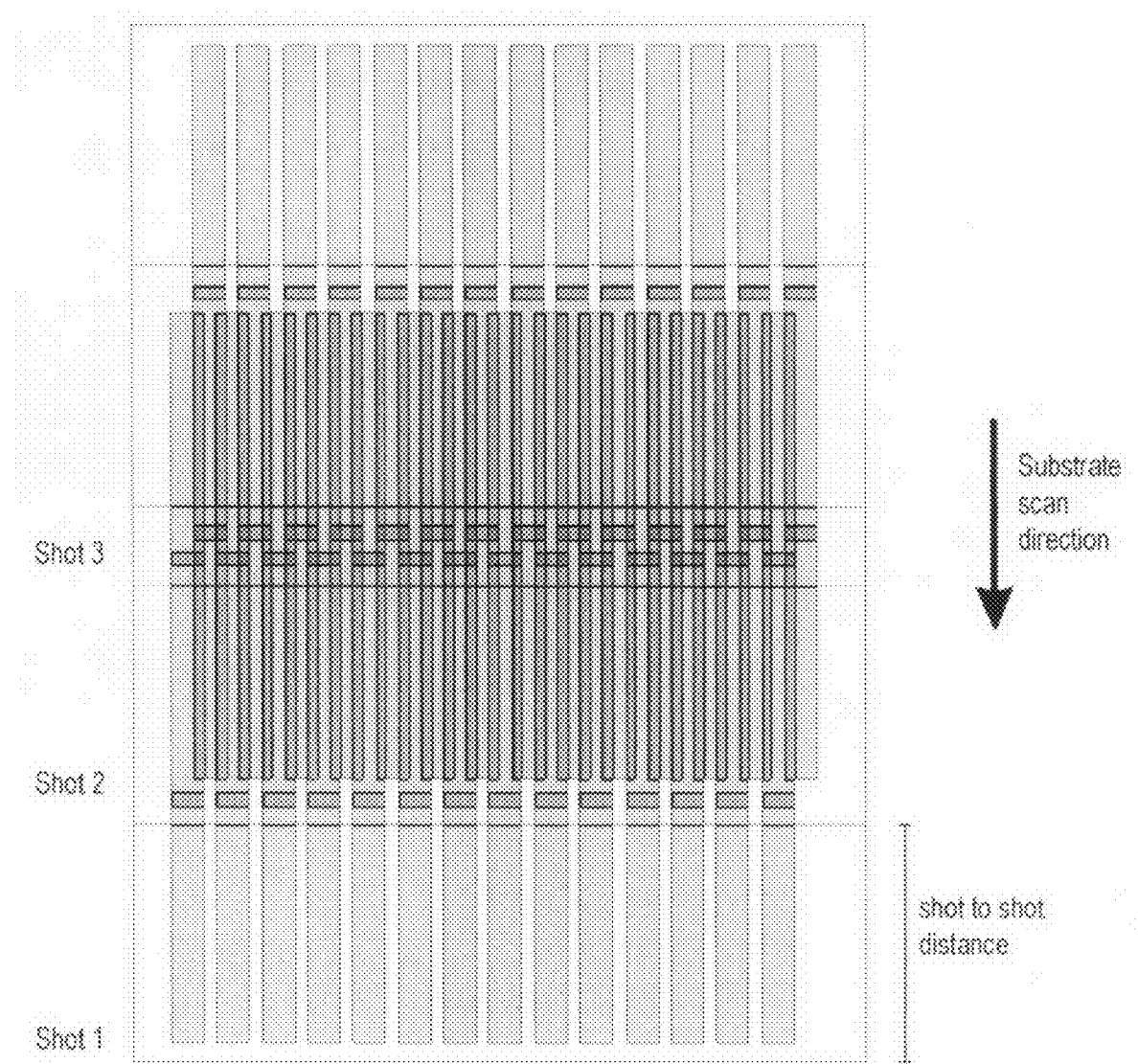
FIG. 7 illustrates SLS processing of a substrate.

FIGS. 6 and 7 provide further illustrations of a typical SLS process pattern and typical SLS processing of a substrate, respectively. The typical SLS process pattern illustrated in FIG. 6 includes typical dimensions for the process pattern and distinguishes between the irradiated areas and the non-irradiated areas that are blocked by the mask. FIG. 7 illustrates the SLS scanning process of one substrate line with N pulses. The substrate is advanced vertically by the shot-to-shot distance between consecutive shots. After finishing one line, the substrate is advanced horizontally to the next line until all substrate area has been irradiated. The vertical shot-to-shot distance is chosen such that every 2 patterns overlap between shot 2 and shot N−1, giving a fully irradiated area without spaces. The outermost areas of shot 1 and shot N correspond to the original pattern and may thus be used for in-situ focus process control with the method described.

It should be recognized that a number of variations of the above-identified embodiments are within the scope of the invention. For example, methods and systems consistent with the present invention may also be utilized with SLS systems for rapid manufacturing of three-dimensional objects from three-dimensional CAD drawings. The invention should not be limited by the specific embodiments described herein. Rather, the scope of the invention is defined by the following claims and their equivalents.

In ablation related applications, the diffracting element in the substrate may not be protrusions like in the SLS case, but the shape and slope of the walls build by the ablation process. The actual shape is also known to be focus dependant, so the concepts of the present invention can also be utilized in these applications.

What is claimed is:

1. A method of calibrating a focal plane of a mask imaging system for use with a sequential lateral solidification (SLS) system, the method comprising:

utilizing the SLS system to form a two dimensional test pattern in a substrate by directing a mask image onto said substrate in a predetermined pattern;

varying a z-position of the focal position of the SLS system while forming the test pattern, with the test pattern exhibiting variations in surface texture in different regions at different z-positions;

storing information concerning the variation of the focal position in a data processing system;

directing an inspection beam of light onto the different regions of the test pattern at a predetermined angle;

detecting the specular and scattered reflections of the inspection beam with an optical detector;

analyzing the variations in the specular and scattered reflections as a function of the different regions of the test pattern; and comparing the analysis of the reflections with the stored information to select one of the z-positions as a calibration.

2. The method of claim 1, wherein the forming of the test pattern comprises forming a first pattern with a first focal position and forming a second pattern with a second focal position, wherein the second focal position differs from the first focal position by a predetermined amount.

3. The method of claim 2, wherein the predetermined amount is a fixed step size.

4. The method of claim 3, wherein the fixed step size is 5 micrometers.

5. The method of claim 1, and further comprising the step of automatically calibrating the system based on the calibration focal position.

6. The method of claim 1, and wherein the test pattern comprises a plurality of substantially parallel rectangular areas.

7. An SLS system, comprising:

an xyz-translation stage for manipulating the x, y and z position of a substrate;

a laser for generating a laser beam to form a two dimensional test pattern in the substrate, the laser having a focal position, said test pattern being formed at varying z-positions, with the test pattern exhibiting variations in surface texture in different regions at different z-positions;

a data processing system for storing information concerning the z-position of the focal position during the formation of said test pattern;

a light source for generating an inspection light beam and for directing the inspection light beam onto the different regions of the test pattern;

an optical detector for detecting the specular and scattered reflections of the inspection light beam that is reflected from the test pattern; and wherein the data processing system analyzes the variations in the detected specular and scattered reflections as a function of the different regions of the test pattern and the data processing system compares the information concerning the z-positions of the focal position utilized during the formation of the test pattern with the results of the analysis of the reflections to select an optimal focal position for calibrating the SLS system.

8. The SLS system of claim 7, and wherein the laser comprises an excimer laser.

9. The SLS system of claim 7, wherein the data processing system is integral to the SLS system.

10. The SLS system of claim 7, wherein the data processing system is separate from the SLS system.

11. The SLS system of claim 7, wherein the test pattern comprises a plurality of substantially parallel rectangular areas.

12. A calibration system for calibrating a focal position of a laser of an SLS system, the calibration system comprising:
- a laser for generating a laser beam;
- optics through which the laser beam passes for forming a two-dimensional test pattern in a substrate, the laser having a focal position;
- a translation stage for varying a z-position of the focal position of the laser while forming the test pattern, said test pattern exhibiting variations in surface texture in different regions at different z-positions;
- a data processing system for storing information concerning the variation of the focal position;
- means for directing an inspection beam of light onto the different regions of the test pattern at a predetermined angle;
- means for detecting the specular and scattered reflections of the inspection beam; and
- wherein the data processing system includes a program for analyzing the variations in the detected specular and scattered reflections as a function of the different regions of the test pattern and for comparing results of the analysis with the stored information to select a specific z-position as a calibration focal position for the laser.

13. The calibration system of claim 12, and wherein the laser comprises an excimer laser.

14. The calibration system of claim 12, and wherein the data processing system is integral to the SLS system.

15. The calibration system of claim 12, and wherein the data processing system is separate from the SLS system.

16. The calibration system of claim 12, and wherein the test pattern comprises a plurality of substantially parallel rectangular areas.

17. The method of claim 1, wherein the inspection beam of light is collimated.

18. The SLS system of claim 7, wherein the inspection light beam is collimated.

19. The calibration system of claim 12, wherein the inspection beam of light is collimated.

* * * * *